(12) United States Patent
Kugai et al.

(10) Patent No.: US 6,713,216 B2
(45) Date of Patent: Mar. 30, 2004

(54) THIN ALKALI METAL FILM MEMBER AND METHOD OF PRODUCING THE SAME

(75) Inventors: Hirokazu Kugai, Itami (JP); Nobuhiro Ota, Itami (JP); Shosaku Yamanaka, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 206 days.

(21) Appl. No.: 09/884,632

(22) Filed: Jun. 18, 2001

(65) Prior Publication Data
US 2002/0028383 A1 Mar. 7, 2002

(30) Foreign Application Priority Data

Jul. 19, 2000 (JP) .................................. 2000-219071
Dec. 15, 2000 (JP) .................................. 2000-382174

(51) Int. Cl.⁷ ............................................... H01M 4/40
(52) U.S. Cl. ........................... 429/231.95; 429/218.1; 429/162; 29/623.5
(58) Field of Search ..................... 429/218.1, 231.95, 429/162; 29/623.5

(56) References Cited

U.S. PATENT DOCUMENTS

| | | | |
|---|---|---|---|
| 5,141,614 A | * | 8/1992 | Akridge et al. ........ 204/192.15 |
| 5,338,625 A | * | 8/1994 | Bates et al. ................. 429/322 |
| 5,561,004 A | * | 10/1996 | Bates et al. ................. 429/162 |
| 5,961,672 A | | 10/1999 | Skotheim et al. |
| 6,168,884 B1 | * | 1/2001 | Neudecker et al. ......... 429/162 |

FOREIGN PATENT DOCUMENTS

| | | |
|---|---|---|
| EP | 0206339 | 12/1986 |
| JP | 62044960 | 2/1987 |
| JP | 05048582 | 7/1993 |
| JP | 10058007 | 3/1998 |

OTHER PUBLICATIONS

Description of MRC sputtering system given at: http://www.sctsystem.com/mrc/903/system.html.*
U.S. patent application Publication No. US 2002/0036131 A1, published on Mar. 28, 2002, Kugai et al., Title: Method of Producing Negative Electrode for Lithium Secondary Cell; Cover page. 1 sheet of drawings, and pp. 1 to 10.

\* cited by examiner

Primary Examiner—Carol Chaney
(74) Attorney, Agent, or Firm—W. F. Fasse; W. G. Fasse

(57) ABSTRACT

A member having a lithium metal thin film is provided, which is extremely thin, uniform, and not degraded by air. The member includes a substrate and a thin lithium metal film formed on the substrate by a vapor deposition method. The thin film typically has a thickness of 0.1 $\mu$m to 20 $\mu$m. The substrate is typically made of a metal, an alloy, a metal oxide, or carbon. The substrate typically has a thickness of 1 $\mu$m to 100 $\mu$m. The member is used as an electrode member for a lithium cell.

19 Claims, 1 Drawing Sheet

THIN ALKALI METAL FILM MEMBER AND METHOD OF PRODUCING THE SAME

CROSS-REFERENCE TO RELATED APPLICATION

This application is related to copending U.S. application Ser. No. 09/884,633, filed on Jun. 18, 2001 (published under number US-2002-0028383-A1 on Mar. 7, 2002), by the same inventors as in the present application.

BACKGROUND OF THE INVENTION

1. Field of the Invention

The present invention relates to a thin alkali metal film member and a method of producing the thin alkali metal film member, and more specifically, to a lithium metal thin film member used for a lithium cell and the like and a method of producing such a lithium metal thin film member.

2. Description of the Background Art

Recent years have seen advances of more compact and lighter electronics, so that cells as the power source for the electronics are required to be more compact and lighter. For such a requirement, a cell using lithium metal for its negative electrode can be useful and notable. In such a cell, it is also desirable to reduce the thickness of lithium metal so that the size of the cell can be reduced as much as possible.

A lithium metal foil or leaf, for example, is produced by rolling. Japanese Patent Laying-Open No. 10-58007 discloses an example of such a process, but the thickness cannot be thinner than 20 $\mu$m. In addition, lithium metal is highly reactive to water and readily degrades when exposed to the air.

On the other hand, solid secondary cells using a thin lithium film have been proposed. Japanese Patent Laying-Open No. 62-44960 discloses a process of a solid secondary cell, in which a thin film of titanium disulfide as a positive electrode, a thin film of $Li_2O$—$Al_2O_3$ as an electrolyte, and a thin film of Li as a negative electrode are orderly formed on a substrate in an ionized cluster beam evaporation system. Moreover, Japanese Patent Publication No. 5-48582 discloses an electrolytic material for such a solid cell. These documents related to solid cells, however, do not suggest the techniques for independently producing a negative electrode itself with lithium.

SUMMARY OF THE INVENTION

One object of the present invention is to provide a technique for producing a thinner lithium metal film that is applicable to a cell.

Another object of the present invention is to provide a lithium metal film member that is significantly thinned, uniformly formed, and not degraded by air.

The present inventors have found that a lithium metal film of 20 $\mu$m or less in thickness can be formed by a vapor deposition method, so that the present invention has been made.

According to the present invention, a thin alkali metal film member is provided, which includes a substrate and a thin film formed on the substrate by a vapor deposition method and made of a material selected from the group consisting of alkali metals and alkali metal alloys.

The thin alkali metal film member according to the present invention may have a thickness of 0.1 $\mu$m to 20 $\mu$m. In order to prevent the formation of pinholes, the thickness of the thin film is preferably at least 0.1 $\mu$m. The thickness of the thin film is preferably in the range from 0.1 $\mu$m to 20 $\mu$m, and is more preferably in the range from 1 $\mu$m to 10 $\mu$m.

In the thin alkali metal film member according to the present invention, the thickness of the thin film may have an in-plane variation within ±30%. In other words, variation in the thickness of the thin film is preferably within ±30% of the average thickness of the thin film over the cross section of the film.

In the thin alkali metal film member according to the present invention, the substrate preferably has a thickness of 1 $\mu$m to 100 $\mu$m. The substrate may be made of a material selected from the group consisting of metals, alloys, metal oxides, and carbon. The substrate is preferably made of a material selected from the group consisting of copper, nickel, aluminum, iron, niobium, titanium, tungsten, magnesium, gold, silver, platinum, alloys composed of two or more metals from the foregoing, and stainless steel.

Typically, in the present invention, the thin film is made of a material selected from the group consisting of lithium and lithium alloys. In particular, the present invention is directed to an electrode member for a lithium cell.

According to the present invention, a method of producing a thin alkali metal film member is provided, which includes the step of forming a thin film made of a material selected from the group consisting of alkali metals and alkali metal alloys on a substrate by a vapor deposition method.

For example, the vapor deposition method is any one selected from the group consisting of sputtering, vacuum evaporation, laser ablation, and ion plating. The vacuum degree of the background in the vapor deposition method is preferably $1.33 \times 10^{-4}$ Pa ($1 \times 10^{-6}$ Torr) or below, since oxidation of the thin alkali metal film or degradation thereof by moisture can occur in low vacuum. In the vapor deposition method, the atmosphere under which the thin film is formed is preferably constituted of a gas inactive to an alkali metal, particularly to lithium, which includes helium, neon, argon, krypton, or a mixture gas of two or more from the foregoing. The purity of the gas constituting the atmosphere is preferably at least 99.99% so that no degradation by moisture occurs in the thin lithium metal film.

The substrate on which the metal thin film such as of lithium is to be deposited may be made of a metal, an alloy, a metal oxide such as $SnO_2$, an electrically conductive carbon such as graphite, or the like. As the metal or the alloy, any one of copper, nickel, aluminum, iron, niobium, titanium, tungsten, indium, molybdenum, magnesium, gold, silver, platinum, or an alloy of two or more metals from the foregoing, or stainless steel may be used. The substrate preferably has a thickness of at most 100 $\mu$m in order to reduce the size of the lithium cell or the like. The thickness of the substrate is preferably at least 1 $\mu$m in order to improve the strength of the substrate. Therefore, the thickness of the substrate may be in the range of 1 $\mu$m to 100 $\mu$m, and may be in the range of 1 $\mu$m to 20 $\mu$m for compactness.

When an alkali metal as a source material for forming a thin film is introduced into a thin film deposition system, and when the thin alkali metal film formed is taken out from the deposition system, it is undesirable to expose the source material or the thin alkali metal film to the air, since such exposure causes degradation of the source material or the film by moisture. Thus, a closed container is preferably used, so that the source material may be taken out from the container in a chamber attached to an inlet of the thin film deposition system and then the source material may be introduced into the thin film deposition system. Preferably, the formed thin alkali metal film is also transferred to a container in a chamber attached to an outlet of the thin film deposition system and then the container holding the film is closed and taken out from the system into the air.

In a preferred embodiment, the process according to the present invention further includes the steps of: taking out from a closed container a material selected from the group consisting of alkali metals and alkali metal alloys in a chamber space which is substantially inactive to the alkali metals and which is insulated from air and provided adjacent to the apparatus for forming the thin film; and transferring the material from the chamber space into the apparatus without exposing the material to the air. The material transferred into the apparatus is used to form the thin film. In a preferred embodiment, the process according to the present invention further includes the steps of: transferring a member, in which the thin film is formed, from the apparatus for forming the thin film into the chamber space which is substantially inactive to the alkali metals and which is insulated from air and provided adjacent to the apparatus for forming the thin film; and placing the transferred member into a closed container in the chamber space.

The chamber space attached to the inlet of the thin film deposition system, the chamber space attached to the outlet of the thin film deposition system, and the thin film deposition system itself may be filled with a gas of helium, nitrogen, neon, argon or krypton, or a mixture gas of two or more from the foregoing. The purity of these gases is preferably at least 99.99%. Alternatively, dry air having a dew point of −50° C. or below may be used in place of such inactive gases. Preferably, the thin film deposition system and the chamber spaces adjacent thereto are filled with the above gas at the time when the source material is taken out to be transferred into the deposition system or when the thin film member prepared is transferred into the chamber space to be placed in a closed container.

The process according to the present invention is applicable to the production of an electrode member for a lithium cell, and in particular, of a negative electrode member for a lithium secondary cell. In this case, a thin film of a material selected from the group consisting of lithium and lithium alloys may be formed on the substrate by a vapor deposition method. In this case, the thin film preferably has a thickness of 20 μm or less. On the produced negative electrode member for a lithium cell, a thin film of an inorganic solid electrolyte may be formed by using a suitable method such as a vapor deposition method to give a negative electrode for a lithium secondary cell.

Thus, according to the present invention, a method of producing a negative electrode member for a lithium cell is further provided. The method includes the step of forming a thin film made of an inorganic solid electrolyte on the thin film made of a material selected from the group consisting of lithium and lithium alloys in the negative electrode member for a lithium cell obtained by the above-described process. The thin film made of the inorganic solid electrolyte typically contains components A to C as follows:

A: lithium, the content of which is in the range of 30% to 65% by atomic percent;

B: one or more elements selected from the group consisting of phosphorus, silicon, boron, germanium, and gallium; and C: sulfur.

The thin film made of the inorganic solid electrolyte may further contain at least one of oxygen and nitrogen. The content of element B is typically in the range of 0.1% to 30% by atomic percent. The content of element C is typically in the range of 20% to 60% by atomic percent. The content of one or both of oxygen and nitrogen is typically in the range of 0.1% to 10%.

In the method of producing a negative electrode member for a lithium cell according to the present invention, the ionic conductance (conductivity) at 25° C. of the thin film made of the inorganic solid electrolyte may be at least $1 \times 10^{-4}$ S/cm.

The foregoing and other objects, features, aspects and advantages of the present invention will become more apparent from the following detailed description of the present invention when taken in conjunction with the accompanying drawings.

Figure 1:
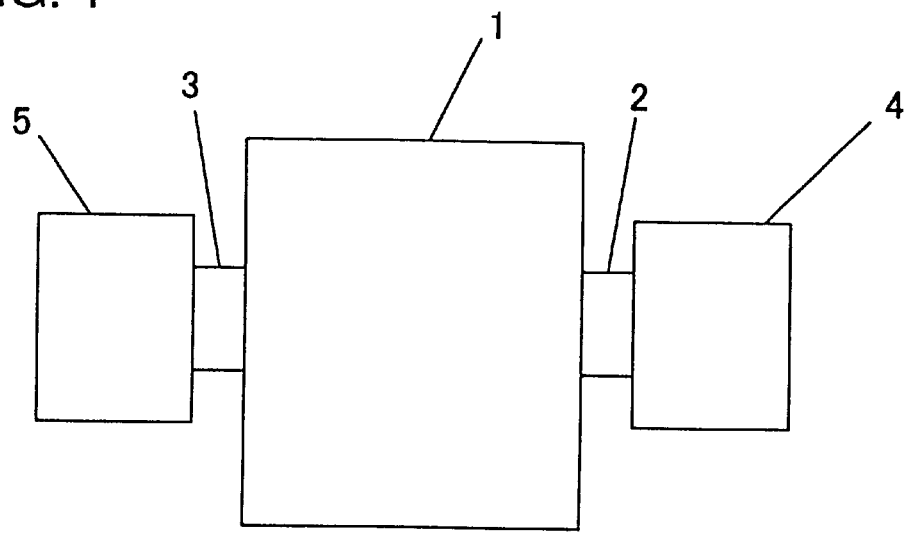
FIG. 1 is a schematic diagram showing the entire apparatus used for the process according to the present invention.

In the drawings, a thin film deposition system is denoted by reference numeral 1, an inlet of the thin film deposition system by 2, an outlet of the thin film deposition system by 3, chambers by 4 and 5, a lithium metal thin film member by 10, a substrate by 11, and a lithium metal thin film by 12.

DESCRIPTION OF THE PREFERRED EMBODIMENTS

EXAMPLE 1

The present invention will be further described below by taking lithium as an example. As in the process shown below, a source material of lithium metal is introduced into a thin film deposition system and the formed thin film of lithium metal are taken out. FIG. 1 shows the entire apparatus used for the production of the thin film. First, the source material of lithium metal held in a closed container of glass, plastic or the like is placed into a chamber 4 attached to an inlet of a thin film deposition system 1. Air is then evacuated from chamber 4. Then, chamber 4 is filled with argon gas having a purity of 99.99%. Thin film deposition system 1 is also filled with argon gas of 99.99% purity. Chamber 4 is equipped with gloves so that one can insert the hands into the gloves to carry out operations within chamber 4. The closed container is opened in chamber 4, and the lithium metal source material is taken out. Then, a door at an inlet 2 of thin film deposition system 1 is opened, the lithium metal source material is set inside thin film deposition system 1, and the door at inlet 2 is closed. In this manner, the lithium metal source material is placed into thin film deposition system 1 without being exposed to air.

After a thin film of lithium metal is formed on the substrate by vapor deposition in system 1, system 1 is filled with argon gas having a purity of 99.99%. Air is evacuated from a chamber 5 attached to an outlet 3 of system 1, and then chamber 5 is filled with argon gas of 99.99% purity. Like chamber 4, chamber 5 is also equipped with gloves so that one can insert the hands into the gloves to carry out operations within chamber 5. A door at outlet 3 of system 1 is opened, the lithium metal thin film member formed is taken out from system 1 and then placed into chamber 5, and the door at outlet 3 is closed. A closed container of glass, plastic or the like has been provided in chamber 5 beforehand. The lithium metal thin film member is placed into the container and the container is closed, and the closed container is taken out into the air. In this manner, the lithium metal thin film member is taken out from system 1 to another place without being exposed to air.

In this process, any one of helium, nitrogen, neon, argon, and krypton, or a mixture gas of two or more from the foregoing, or dry air having a dew point of −50° C. or below can be used without a problem. The gases used in the respective chambers and the thin film deposition system may be the same or different as required.

The apparatus as shown in FIG. 1 has both of inlet 2 and outlet 3 for the thin film deposition system. Alternatively, one passage may double as the inlet and the outlet, and one chamber may be provided though which the source material is introduced into the thin film deposition system and the thin film member is taken out from the thin film deposition system.

Under various conditions, thin lithium metal films were formed on substrates by vapor deposition. Table 1 shows the conditions including the lithium film forming technique, the degree of vacuum of the background in the vapor deposition, the atmosphere gas used in the deposition, the thickness of the thin lithium metal film formed, the material for the substrate, and the thickness of the substrate. The atmosphere gas employed in the deposition by sputtering or laser ablation had a purity of 99.99%.

In all the thin lithium metal films formed, variation range of the thickness in a plane (within a cross section) was within ±30% of the average thickness, showing uniform formation. The surfaces of the thin films were examined under an optical microscope. As a result, a pinhole was found at one site of sample No. 4 in which the thickness of the lithium metal film was 0.1 μm. No pinholes were found in the other lithium metal films. In the samples, moisture-degraded portions were not found.

Figure 2:
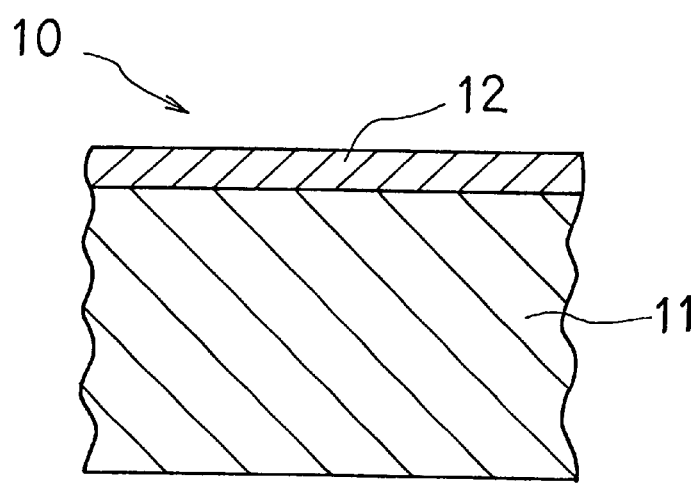
FIG. 2 is a cross sectional view schematically showing an example of the member according to the present invention.

FIG. 2 shows an example of the member according to the present invention. In a lithium metal thin film member 10, a lithium metal thin film 12 is formed on a substrate 11 by a vapor deposition method. Thin film 12 has a specific texture produced by the vapor deposition method. Thin film 12 typically has a thickness of 0.1 μm to 20 μm, and preferably of 1 μm to 10 m. Substrate 11 typically has a thickness of 1 μm to 100 μm.

The member according to the present invention may particularly be used as an electrode member for a lithium cell. Typically, a necessary material such as an inorganic solid electrolyte may be provided on the thin lithium metal film of the member according to the present invention to produce a negative electrode for a lithium secondary cell. Such a negative electrode may be combined with necessary components such as a separator of porous polymer, a positive electrode, and an organic solution of electrolytes to produce a lithium secondary cell. The inorganic solid electrolytes may include sulfides, oxides, nitrides, and mixtures thereof such as oxynitrides and oxysulfides. The sulfides may include $Li_2S$, a compound of $Li_2S$ and $SiS_2$, a compound of $Li_2S$ and $GeS_2$, and a compound of $Li_2S$ and $Ga_2S_3$. The oxynitrides may include $Li_3PO_{4-x}N_{2x/3}$, $Li_4SiO_{4-x}N_{2x/3}$, $Li_4GeO_{4-x}N_{2x/3}$ (0<x<4), and $Li_3BO_{3-x}N_{2x/3}$ (0<x<3).

Instead of the lithium described above, lithium alloys may be used. The additive elements of such lithium alloys may include In, Ti, Zn, Bi, and Sn. The lithium alloys may be deposited on the substrate by a common vapor deposition method such as sputtering, vacuum evaporation, or laser ablation.

According to the present invention, thin films of other alkali metals may be provided. For instance, a thin film of

TABLE 1

| No. | Deposition technique | Degree of vacuum of background (Torr) | Atmosphere gas | Atmosphere gas pressure (Torr) | Metal film thickness (μm) | Material for substrate | Thickness of substrate (μm) |
|---|---|---|---|---|---|---|---|
| 1 | Sputtering | $5 \times 10^{-7}$ | Argon | 0.1 | 5 | Copper | 1 |
| 2 | Sputtering | $5 \times 10^{-7}$ | Argon | 0.1 | 5 | Copper | 10 |
| 3 | Sputtering | $5 \times 10^{-7}$ | Argon | 0.1 | 5 | Copper | 100 |
| 4 | Vacuum evaporation | $5 \times 10^{-7}$ | — | | 0.1 | Copper | 10 |
| 5 | Vacuum evaporation | $5 \times 10^{-7}$ | — | | 1 | Copper | 10 |
| 6 | Vacuum evaporation | $5 \times 10^{-7}$ | — | | 5 | Copper | 10 |
| 7 | Vacuum evaporation | $5 \times 10^{-7}$ | — | | 10 | Copper | 10 |
| 8 | Vacuum evaporation | $5 \times 10^{-7}$ | — | | 20 | Copper | 10 |
| 9 | Vacuum evaporation | $5 \times 10^{-7}$ | — | | 5 | Nickel | 10 |
| 10 | Vacuum evaporation | $5 \times 10^{-7}$ | — | | 5 | Aluminum | 10 |
| 11 | Vacuum evaporation | $5 \times 10^{-7}$ | — | | 5 | Iron | 10 |
| 12 | Vacuum evaporation | $5 \times 10^{-7}$ | — | | 5 | Titanium | 10 |
| 13 | Vacuum evaporation | $5 \times 10^{-7}$ | — | | 5 | Niobium | 10 |
| 14 | Vacuum evaporation | $5 \times 10^{-7}$ | — | | 5 | Tungsten | 10 |
| 15 | Vacuum evaporation | $5 \times 10^{-7}$ | — | | 5 | Indium | 10 |
| 16 | Vacuum evaporation | $5 \times 10^{-7}$ | — | | 5 | Magnesium | 10 |
| 17 | Vacuum evaporation | $5 \times 10^{-7}$ | — | | 5 | Molybdenum | 10 |
| 18 | Vacuum evaporation | $5 \times 10^{-7}$ | — | | 5 | Gold | 10 |
| 19 | Vacuum evaporation | $5 \times 10^{-7}$ | — | | 5 | Silver | 10 |
| 20 | Vacuum evaporation | $5 \times 10^{-7}$ | — | | 5 | Platinum | 10 |
| 21 | Vacuum evaporation | $5 \times 10^{-7}$ | — | | 5 | SUS304 | 10 |
| 22 | Vacuum evaporation | $5 \times 10^{-7}$ | — | | 5 | Graphite | 100 |
| 23 | Vacuum evaporation | $1 \times 10^{-6}$ | — | | 5 | Copper | 10 |
| 24 | Vacuum evaporation | $5 \times 10^{-10}$ | — | | 5 | Copper | 10 |
| 25 | Laser ablation | $5 \times 10^{-7}$ | Argon | $2 \times 10^{-2}$ | 1 | Copper | 10 |
| 26 | Laser ablation | $5 \times 10^{-7}$ | Argon | $2 \times 10^{-2}$ | 5 | Copper | 10 |
| 27 | Laser ablation | $5 \times 10^{-7}$ | Argon | $2 \times 10^{-2}$ | 10 | Copper | 10 |
| 28 | Laser ablation | $5 \times 10^{-7}$ | Neon | $2 \times 10^{-2}$ | 5 | Copper | 10 |
| 29 | Laser ablation | $5 \times 10^{-7}$ | Helium | $2 \times 10^{-2}$ | 5 | Copper | 10 |
| 30 | Ion plating | $5 \times 10^{-7}$ | — | — | 5 | Copper | 10 |

(1 Torr = 101325/760 Pa)

EXAMPLE 2

A Li$_2$S—SiS$_2$—P$_2$O$_5$-based target was sputtered at room temperature under an Ar gas atmosphere to deposit a thin film of the inorganic solid electrolyte having a thickness of 1 μm on the thin lithium metal film of member No. 7 in Table 1. By this process, a negative electrode member for a lithium cell was obtained. In this process, other thin lithium metal films may be used in place of the lithium film of No. 7 in Table 1. The thin film of the inorganic solid electrolyte may be prepared by any one technique of sputtering, vacuum evaporation, laser ablation, and ion plating. After the thin lithium metal film is formed, the thin film of the inorganic solid electrolyte may also be formed successively in the same apparatus. Alternatively, the substrate may be transferred to another apparatus and then the thin film of the inorganic solid electrolyte may be formed therein.

An X-ray diffraction analysis revealed that the thin film of the inorganic solid electrolyte formed was in an amorphous state. The ionic conductance of the thin film of the inorganic solid electrolyte was $3 \times 10^{-4}$ S/cm at 25° C. A composition analysis revealed that the thin film had a composition of Li (0.43): Si (0.12): S (0.44): P (0.003): O (0.007) by atomic ratio.

The negative electrode member with the thin film of the organic solid electrolyte formed as described above was used to prepare a lithium secondary cell and the characteristics of the cell were evaluated. A mixture solution of ethylene carbonate (EC) and propylene carbonate (PC) was heated, and then LiPF$_6$ was dissolved in the solution. Polyacrylonitrile (PAN) was dissolved in the mixture solution in a high concentration. The solution was cooled to give a PAN preparation containing large amounts of EC and PC with LiPF$_6$ dissolved. LiCoO$_2$ particles as an active material and carbon particles for providing electron conductivity were added to the PAN preparation. The resulting mixture was applied in a thickness of 300 μm onto a 20 μm-thick aluminum foil or leaf (a collector member for a positive electrode) to produce a positive electrode.

The negative electrode member having the thin film of the inorganic solid electrolyte formed thereon as described above, a separator (porous polymer film), and the positive electrode were stacked and then placed into a stainless steel container to be sealed. An organic solution of an electrolyte containing 1 mole % LiPF$_6$ as the electrolytic salt in a mixture solution of ethylene carbonate and propylene carbonate was added dropwise to the container. In such a process, a lithium secondary cell was prepared under an argon gas atmosphere having a dew point of −60° C. or below.

The prepared cell was examined for the charge and discharge characteristics. In the examination, the cell was charged at a voltage of 4.2 V and maintained a capacity of 0.5 Ah (ampere-hour) until a constant discharge at 100 mA allowed the voltage to drop to 3.5 V. The energy density of the cell was 490 Wh (watt-hour)/l (liter). The cell also remained stable after one hundred cycles of charge and discharge under the same conditions.

The obtained electrode member for a lithium cell was very thin. In this Example, the inorganic solid electrolyte is deposited on the thin lithium metal film. Such a process can provide a highly stabile negative electrode member for a lithium secondary cell, which can be less prone to the dendroid growth of the lithium metal on the negative electrode during charging and discharging and have excellent charging and discharging cycle characteristics.

EXAMPLE 3

Except that Li$_2$S—SiS$_2$—Li$_2$O—P$_2$O$_5$ was used for the target, a thin film of an inorganic solid electrolyte was formed on the thin lithium metal film, and a negative electrode and a secondary cell were prepared and evaluated, as in Example 2. The thin film of the inorganic solid electrolyte had a composition of Li (0.43): Si (0.12): S (0.44): P (0.002): O (0.008) by atomic ratio, and a ionic conductance of $4 \times 10^{-4}$ S/cm. Except for these, the results were the same as those obtained in Example 2.

EXAMPLE 4

Except that Li$_2$S—SiS$_2$ was used for the target, a thin film of an inorganic solid electrolyte was formed on the thin lithium metal film, and a negative electrode and a secondary cell were prepared and evaluated, as in Example 2. The thin film of the inorganic solid electrolyte had a composition of Li (0.40): Si (0.13): S (0.47): O (below detection limit) by atomic ratio, and a ionic conductance of $3.5 \times 10^{-4}$ S/cm. Other than these, the results were the same as those obtained in Example 2.

EXAMPLE 5

Except that Li$_2$S—SiS$_2$—Li$_3$PO$_4$ was used for the target, a thin film of an inorganic solid electrolyte was formed on the thin lithium metal film, and a negative electrode and a secondary cell were prepared and evaluated, as in Example 2. The thin film of the inorganic solid electrolyte had a composition of Li (0.41): Si (0.13): S (0.45): P (0.002): O (0.008) by atomic ratio, and a ionic conductance of $4.5 \times 10^{-4}$ S/cm. Except for these, the results were the same as those obtained in Example 2.

As described above, the thin alkali metal film, in particular the thin lithium metal film provided according to the present invention can be extremely thin, uniform, and not degraded by air. Members having such a thin film are particularly useful as an electrode member for a cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin alkali metal film member, comprising: a substrate; and a thin alkali metal film formed directly on said substrate by vapor deposition of a material selected from the group consisting of alkali metals and alkali metal alloys, wherein said thin alkali metal film has a film thickness within the range of 0.1 μm to 20 μm, wherein an in-plane thickness variation range of said thin alkali metal film is within ±30% of said film thickness, and wherein said substrate is made of a material selected from the group consisting of copper, nickel, aluminum, iron, niobium, titanium, tungsten, indium, molybdenum, magnesium, alloys composed of at least two metals from said group, stainless steel, and electrically conductive carbon.

2. The thin alkali metal film member according to claim 1, wherein said thin alkali metal film has a thickness of 1 μm to 10 μm.

3. The thin alkali metal film member according to claim 1, wherein said substrate has a thickness of 1 μm to 100 μm.

4. The thin alkali metal film member according to claim 1, wherein said thin alkali metal film is made of a material selected from the group consisting of lithium and lithium alloys.

5. The thin alkali metal film member according to claim 4, constructed as an electrode for a lithium cell.

6. A method of producing a thin alkali metal film member, comprising the following steps:

(a) preparing a substrate of a material selected from the group consisting of copper, nickel, aluminum, iron, niobium, titanium, tungsten, indium, molybdenum, magnesium, alloys composed of at least two metals from said group, stainless steel, and electrically conductive carbon, (b) vapor depositing directly on said substrate a thin alkali metal film made of a source material selected from the group consisting of alkali metals and alkali metal alloys, and (c) continuing said vapor depositing step until said thin alkali metal film has a film thickness within the range of 0.1 $\mu$m to 20 $\mu$m and an in-plane thickness variation range of ±30% of said film thickness.

7. The method according to claim 6, wherein said vapor depositing step is any step selected from the group consisting of sputtering, vacuum evaporation, laser ablation, and ion plating.

8. The method according to claim 6, wherein said vapor deposition method is carried out in a vacuum of not greater than $1.33 \times 10^{-4}$ Pa ($1 \times 10^{-6}$ Torr).

9. The method according to claim 6, wherein said step of vapor depositing is performed in a gas atmosphere selected from the group consisting of helium, neon, argon, krypton, and a mixture gas of two or more gases from said group.

10. The method according to claim 9, wherein said gas atmosphere has a purity of at least 99.99%.

11. The method according to claim 6, comprising the further steps of:

(d) enclosing said source material in a container and closing said container to provide a closed container holding said source material, (e) placing said closed container with said source material held inside said closed container, into an auxiliary chamber (4) of a thin film deposition system, (f) evacuating said auxiliary chamber (4) to form an evacuated chamber, (g) opening said closed container and removing said source material from said now open container inside said evacuated chamber, and (h) transferring said source material from said evacuated chamber into said thin film deposition system and then performing said vapor depositing step (b) in said thin film deposition system to produce said thin alkali metal film member.

12. The method according to claim 11, further comprising introducing into said evacuated chamber and into said thin film deposition system a gas selected from the group consisting of helium, nitrogen, neon, argon, krypton, a mixture gas of two or more gases from said group, and dry air having a dew point of −500° C. or lower, when said source material is taken out of said container in said auxiliary chamber and transferred into said thin film deposition system.

13. The method according to claim 6, further comprising removing said thin alkali metal film member from said thin film deposition system into an evacuated space for avoiding exposing said thin alkali metal film member to air, placing said thin alkali metal film member into a closable container in said evacuated space, and closing said closable container.

14. The method according to claim 13, further comprising introducing into said evacuated space and into said thin film deposition system a gas selected from the group consisting of helium, nitrogen, neon, argon, krypton, a mixture gas of two or more gases from said group, and dry air having a dew point of −50° C. or lower, when said thin alkali metal film member is transferred into said evacuated space and placed into said closable container.

15. The method according to claim 6, wherein said source material for said thin alkali metal film is selected from the group consisting of lithium and lithium alloys for producing a negative electrode for a lithium cell.

16. The method according to claim 15, further comprising forming an inorganic solid electrolyte layer on said thin alkali metal film for producing said negative electrode for said lithium cell.

17. The method according to claim 16, further comprising making said inorganic solid electrolyte layer of a material containing lithium within the range of 30% to 65% by an atomic percentage, sulfur, and at least one or more elements selected from the group consisting of phosphorus, silicon, boron, germanium, and gallium.

18. The method according to claim 16, wherein said inorganic solid electrolyte layer further contains at least one element selected from the group consisting of oxygen and nitrogen.

19. The method according to claim 16, wherein said inorganic solid electrolyte layer has an ionic conductance of at least $1 \times 10^{-4}$ S/cm at 25° C.

* * * * *

UNITED STATES PATENT AND TRADEMARK OFFICE
CERTIFICATE OF CORRECTION

PATENT NO.   : 6,713,216 B2
DATED        : March 30, 2004
INVENTOR(S)  : Kugai et al.

Page 1 of 1

It is certified that error appears in the above-identified patent and that said Letters Patent is hereby corrected as shown below:

<u>Title page,</u>
Item [*] Notice, delete the phrase "by 206" and insert -- by 152 days --

Signed and Sealed this

Tenth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,713,216 B2  Page 1 of 1
APPLICATION NO. : 09/884632
DATED : March 30, 2004
INVENTOR(S) : Kugai et al.

It is certified that error appears in the above-identified patent and that said Letters Patent is hereby corrected as shown below:

On the Title Page, Column 2:
Under "FOREIGN PATENT DOCUMENTS", following line 4, insert

| | | |
|---|---|---|
| --JP | 56-156674 | 12/1981 |
| JP | 60-072170 | 04/1985 |
| JP | 08-167425 | 06/1996 |
| JP | 10-083838 | 03/1998 |
| PCT | WO00/28608 | 05/2000 |
| JP | 2001-284048 | 10/2001 |
| JP | 2002-015728 | 01/2002--. |

Under "OTHER PUBLICATIONS"
line 2, replace "www.sctsystem.com/.mrc/903/system.html." by
--www.sctsystems.com/.mrc/903/system.html.--;
following line 6, insert:
--US Patent Application Publication No. US 2003/0180608 A1, published on
September 25, 2003, Mori et al., Title: Lithium Secondary Cell and Method
for Manufacture Thereof; Cover page. 2 sheets of drawings, and pages
1 to 3.--.

Column 6:
line 7, after "to", replace "10 m." by --10 $\mu$m.--.

Column 10:
line 11, after "of", replace "-500°C" by -- -50°C--.

Signed and Sealed this

Thirteenth Day of May, 2008

JON W. DUDAS
*Director of the United States Patent and Trademark Office*